United States Patent
Neary

(10) Patent No.: US 6,415,431 B1
(45) Date of Patent: Jul. 2, 2002

(54) REPAIR OF PHASE SHIFT MATERIALS TO ENHANCE ADHESION

(75) Inventor: Timothy E. Neary, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/507,987

(22) Filed: Feb. 18, 2000

(51) Int. Cl.$^7$ .................. G06F 17/50; G06F 19/00; H01L 21/27; G06K 9/03; C23C 14/04

(52) U.S. Cl. .................. 716/21; 700/110; 700/105; 700/120; 700/121; 430/5; 378/35; 382/144; 438/378; 427/526

(58) Field of Search .................. 716/1–21; 700/105, 700/108–110, 117–121; 430/4–5; 378/34–35; 382/141–151; 438/378; 427/526

(56) References Cited

U.S. PATENT DOCUMENTS

| | | | |
|---|---|---|---|
| 4,906,326 A | * 3/1990 | Amemiya et al. | 430/5 |
| 4,952,421 A | * 8/1990 | Morimoto et al. | 427/526 |
| 5,104,684 A | 4/1992 | Tao et al. | 427/526 |
| 5,429,730 A | * 7/1995 | Nakamura et al. | 204/192.34 |
| 5,506,080 A | 4/1996 | Adair et al. | 430/5 |
| 5,536,602 A | * 7/1996 | Nakao | 430/5 |
| 5,799,104 A | 8/1998 | Nakamura et al. | 382/144 |
| 5,849,638 A | 12/1998 | Ho et al. | 438/712 |
| 5,876,879 A | 3/1999 | Kleinhenz et al. | 430/5 |
| 5,882,823 A | 3/1999 | Neary | 430/5 |
| 5,935,737 A | * 8/1999 | Yan | 430/5 |
| 5,958,629 A | * 9/1999 | Yan et al. | 430/5 |
| 6,150,060 A | * 11/2000 | Vernon | 430/5 |

FOREIGN PATENT DOCUMENTS

JP 404144193 A * 5/1992 ............ H05K/3/46

OTHER PUBLICATIONS

Okazaki et al. ("Phase shift reticles", International Electron Devices Meeting, 1991, Technical Digest, Dec. 8, 1991, pp. 55–58).*

Bae et al. ("Investigation of half–tone phase shift mask with FIB and blue laser repair", Th International Conference on VLSI and CAD, Oct. 26, 1999, pp. 159–162).*

Watanabe et al. ("Repair technique for phase–shifting masks using silicon–containing resist", IEEE Transactions on Electron Devices, vol. 40, No. 12, Dec. 1993, pp. 2211–2215).*

Van Camp ("Reliability of a focused ion beam repair on digital CMOS circuits", Proceedings of the 17th European Symposium on Reliability of Electron Devices, Failure Physics and Analysis, Oct. 8, 1996, pp. 1787–1790).*

* cited by examiner

Primary Examiner—Matthew Smith
Assistant Examiner—Phallaka Kik
(74) Attorney, Agent, or Firm—Delio & Peterson, LLC; John J. Tomaszewski; Richard M. Kotulak

(57) ABSTRACT

A method and apparatus are provided for repairing clear defects in photomasks such as attenuated photomasks having a patterned MoSi film on a glass substrate. The method and apparatus use an energy source in the form of an energy beam to undercut the sidewalls of the clear defect forming a clear defect having angled sidewalls. A repair material is then deposited in the angled opening to repair the clear defect. In a preferred embodiment, two repair steps are used with the first repair step using a first repair material to deposit a first repair material on the angled sidewalls of the clear defect and a second step using a second repair material to contact the first repair material and to fill the remainder of the clear defect opening. An apparatus for repairing clear defects and photomasks repaired by the method and apparatus of the invention is also provided.

19 Claims, 4 Drawing Sheets

REPAIR OF PHASE SHIFT MATERIALS TO ENHANCE ADHESION

BACKGROUND OF THE INVENTION

1. Field of the Invention

This invention relates to a method and apparatus for repairing defects in photomasks used in the manufacture of semiconductor microcircuits and other electronic components to transfer a pattern onto a workpiece and, in particular, to repairing clear (transparent) defects in attenuated phase shift masks. The defects are in the form of pin holes or entire missing portions in the mask pattern which defects are transferred eventually to the electronic component substrate during use of the attenuated mask.

2. Description of Related Art

In the manufacture of circuit patterns on electronic components such as the manufacture of integrated circuits on semiconductor substrates photomasks are used to transfer the desired circuit pattern onto the substrate workpiece. Typically, a photomask comprises a patterned film such as chromium, nickel, aluminum or molysilicide deposited on a transparent base such as glass or quartz. The photomask is generally manufactured by depositing a thin layer of the film on the surface of the transparent substrate, coating the film with a photoresist coating, exposing the desired pattern on the photoresist coating, developing the resist coating, and removing the film from the unprotected areas by etching leaving a patterned film on the substrate.

The pattern contained in the photomask is reproduced onto the surface of a workpiece typically by placing the mask over the workpiece and irradiating a radiation-sensitive resist material on the workpiece. The variety of radiation sources for lithography that have been used or proposed include visible light, ultraviolet light, x-ray radiation, electrons and ions. When illuminated by the radiation, the pattern on the photomask serves to selectively block portions of the radiation beam while allowing other portions to be transmitted therethrough. In this manner, complex geometries having very narrow line widths can be reproduced allowing the economical production of very large scale integrated circuits and other devices.

A photomask is typically employed a large number of times for the production of numerous electronic devices. This places stringent demands on the quality of a photomask since any flaws or defects in the photomask are reproduced in the workpiece which directly effects the operability of the workpiece.

The process of fabricating photomasks, however, typically causes several defects in the pattern. The defects are usually classified as opaque and clear with opaque defects arising where excess film material exists in an unwanted area and clear defects arising where the film material is missing from a desired area such as a pinhole in a line pattern.

Method and apparatus are commercially available for repairing mask defects by focusing an ion beam on the defect area. A gas such as organometallic gas $WF_6$, trimethylaluminum, or the like is discharged from a gas nozzle and the gas is supplied in the vicinity of the defect. The defect portion is irradiated by the ion beam simultaneously. By doing so, the gas is decomposed by irradiation of the ion beam and a metal, carbon and the like which is the component of the gas selectively forms a thin film on the defect portion. In this manner, the defect portion is repaired. Basically, a patch is provided in the clear defect which patch forms an opaque portion repairing the clear defect. Such apparatus use backscattering electrons for imaging and are automated including computer control of an optical X-Y table and the ion beam source so that a mask can be scanned, the position of clear defects is noted from other inspection systems and the data placed in the apparatus for computer controlled positioning of the mask and operation of the ion beam to patch the clear defects.

A number of patents have issued in the art of repairing defective photomasks and include U.S. Pat. Nos. 4,952,421; 5,104,684; 5,506,080, 5,799,104; and 5,882,823. These patents discuss the various type photomasks and the different methods employed to repair defects on the mask and the disclosures of each of the above patents are hereby incorporated by reference. The following description will be directed to the repair of attenuated masks such as masks containing a layer of MoSi on a quartz substrate but it will be appreciated by those skilled in the art that the invention applies to other masks such as optical masks, x-ray masks, attenuated phase shift masks and alternating phase shift masks which may be made using a variety of metals as the patterning design such as chrome, MoSi, and chrome oxide fluoride on a variety of substrates.

The type of mask to which this invention is particularly directed is an attenuated mask which is generally built using a transfer layer of chrome that allows the chrome to act as a mask to the attenuated film under the chrome layer. The transfer layer of chrome is generally patterned as noted above with the differences being that the chrome will eventually be removed exposing a pattern of attenuated material under the chrome forming the desired attenuated mask circuit pattern.

SUMMARY OF THE INVENTION

Bearing in mind the problems and deficiencies of the prior art, it is an object of the present invention to provide a method to repair clear defects in photomasks used to make electronic components such as semiconductors.

It is a further object of the invention to provide an apparatus to repair clear defects in photomasks used to make semiconductor electronic components.

It is another object of the invention to provide photomasks made in accordance with the method and apparatus of the invention.

It is another object of the present invention to provide a method to repair transparent defects in attenuated masks which are used to make electronic components such as semiconductors.

It is a further object of the present invention to provide an apparatus to repair transparent defects in attenuated photomasks used to make semiconductors and other electronic components.

A further object of the invention is to provide attenuated photomasks made in accordance with the method and apparatus of the invention.

Other advantages of the invention will be readily apparent from the following description.

The above and other objects and advantages, which will be apparent to one of skill in the art, are achieved in the present invention which is directed, in a first aspect, to a method of repairing a mask defect in a pattern layer on a substrate wherein the defect has sidewalls in the pattern layer the layer having a top surface and a bottom surface and being positioned on a top surface of a substrate comprising the steps of:

undercutting the sidewalls of the defect to form new sidewalls having an angle wherein the top surface of the pattern layer overhangs the lower surface of the pattern layer; and filling the undercut defect with a repair material.

In a further aspect of the invention, a method is provided for repairing a photolithography mask defect in a pattern layer on a substrate wherein the defect has sidewalls in the pattern layer the layer having a top surface and a bottom surface and being positioned on a top surface of a substrate comprising the steps of:

undercutting the sidewalls of the defect to form new sidewalls having an angle, wherein the top surface of the pattern layer overhangs the lower surface of the pattern layer;

depositing a first portion of a first repair material on the new sidewall and preferably depositing the first repair material to maintain the same new sidewall angle; and depositing a second portion of a second repair material preferably substantially perpendicular to the top surface of the pattern layer, the second portion contacting the first portion and filling the defect.

In another aspect of the invention, an apparatus is provided for repairing clear defects in photomasks used in the manufacture of electronic components such as semiconductors, the photomask having a defect in a circuit pattern layer thereon wherein the defect has sidewalls in the pattern layer the layer having a top surface and a bottom surface and being positioned on a substrate comprising:

a holding device for securing a photomask comprising a substrate and a circuit pattern layer thereon;

moving means for moving the secured photomask in an X-Y plane;

detecting means for locating and identifying a clear defect in the pattern layer, which defect has sidewalls in the pattern layer;

energy means to direct an angled energy beam at the surface of the photomask for removing pattern layer material from the sidewall of the photomask;

positioning means to position the photomask under the energy means so that the energy beam will be directed to a particular X-Y position of the photomask whereby when the defect is to be repaired, the photomask is positioned and the energy means activated to ablate (undercut) the defect sidewalls of the photomask pattern to undercut the sidewalls to form new angled sidewalls so that the top surface of the pattern layer overhangs the lower surface of the pattern layer; and filling means to fill the undercut defect with a repair material.

In a further aspect of the invention, the filling means is used to deposit a first repair material on the new sidewalls preferably maintaining the same sidewall angle and a second filling means is used to deposit a second repair material preferably substantially perpendicular to the top surface of the pattern layer, the second repair material contacting the first repair material and filling the defect.

Photomasks made by the method and using the apparatus of the invention are also provided herein.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
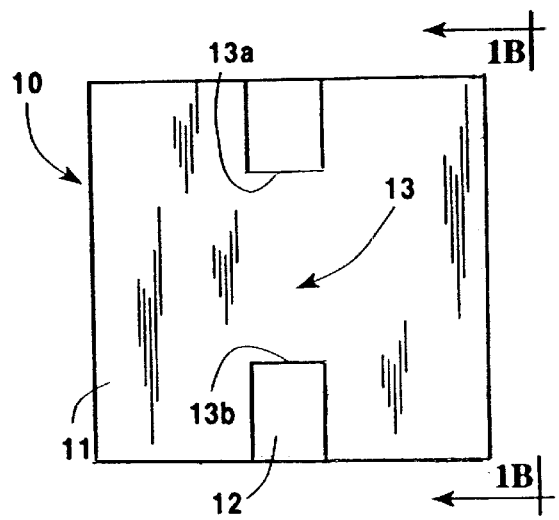
FIG. 1A shows an enlarged plan partial view of a photomask having a clear defect thereon.

In describing the preferred embodiment of the present invention, reference will be made herein to FIGS. 1–4 of the drawings in which like numerals refer to like features of the invention. Features of the invention are not necessarily shown to scale in the drawings.

The present invention is used to repair clear defects in photomasks, and any type photomask may be repaired using the method and apparatus of the invention. Exemplary photomasks include chrome on quartz, attenuator on quartz, absorber metal in x-ray masks and chrome oxide fluoride. For convenience, the following description will be directed to attenuated photomasks containing a MoSi layer on a quartz substrate. These masks, as noted above, typically comprise a MoSi film such as in a thickness in the order of about 600 Å to 1500 Å e.g., 1,000 Å, deposited on a transparent base such as glass or quartz. Also for convenience, the following description will be directed to the repair of patterns in the form of conductor lines although it will be appreciated by those skilled in the art that other type patterns (e.g. pads) may likewise be repaired using the method and apparatus of the invention.

Basically, the invention comprises a method for repairing a MoSi layer in the form of a line which line contains a clear defect by undercutting the sidewalls of the clear defect MoSi layer to form new angled sidewalls so that the top surface of the MoSi layer of the defect overhangs the lower surface of the MoSi layer of the defect. The undercut defect is then filled with a repair material. In a preferred embodiment of the invention, the undercut clear defect containing pattern layer is first deposited with a first repair material preferably at the same angle of the undercut new sidewall. Next, the same or a different repair material is then deposited preferably perpendicular to the top surface of the MoSi layer with the second repair material contacting the first repair material and filling the defect.

Referring now to FIG. 1A, an enlarged plan partial view of a MoSi line containing photomask is shown. The photomask generally shown as 10 comprises a glass or quartz substrate 11 with a MoSi line 12 on the surface thereof. The line 12 is shown as a conductor line and a mask such as would be used to form circuitry on a semiconductor device. A clear defect 13 is shown separating the ends 13a and 13b of conductor line 12. This is the clear defect which is to be repaired using the method of the invention.

Figure 1B:
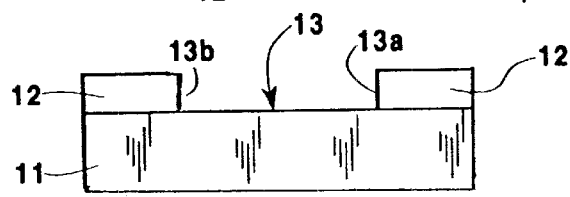
FIG. 1B is a cross-sectional side view along the lines 1B—1B of FIG. 1A.

Referring now to FIG. 1B which is a cross-sectional view of FIG. 1A taken along lines 1B—1B, the quartz substrate 11 is shown having the clear defect MoSi layer 12 thereon. The opening 13 represents the clear defect with the edges of the defect shown as 13a and 13b.

Figure 1C:
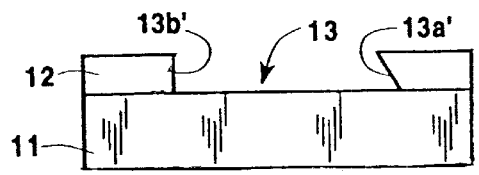
FIGS. 1C–1E show a series of steps to repair the clear defect of FIGS. 1A and 1B.

Referring now to FIG. 1C, sidewalls 13a and 13b of defect 13 are shown undercut forming angled new sidewalls 13a' and 13b', respectively. The undercutting of the MoSi material may be done by a laser beam or other energy means as described hereinbelow.

Figure 1D:
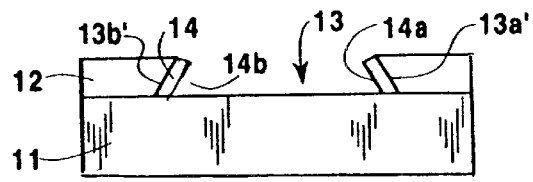

Referring now to FIG. 1D, the undercut clear defect new sidewall MoSi layer 13a' and 13b' is coated with a first repair material 14 which is deposited on the undercut sidewalls 13a' and 13b' forming new sidewalls 14a and 14b of the first repair material. The first repair material 14 may be any suitable material such as gold or carbon and deposited by a focused ion beam. Note that the first repair material 14 is deposited on undercut sidewalls 13a' and 13b' so that the first repair material maintains essentially the same angle as the new undercut sidewalls. This is the preferred method. Deposited sidewalls 14a and 14b may be vertical but this is not preferred.

Figure 1E:
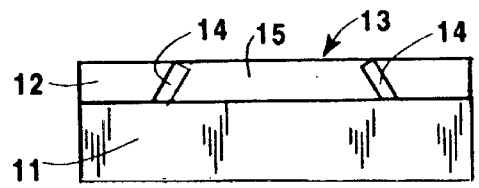

In FIG. 1E, a second repair material 15 is shown filling the clear defect opening 13. The second repair material 15 is preferably deposited substantially perpendicular to the surface of MoSi layer 12 and contacts sidewalls 14a and 14b and fills the defect opening 13. The second repair material is preferably the same as the first repair material and is also preferably applied using the same application procedure.

Figure 1F:
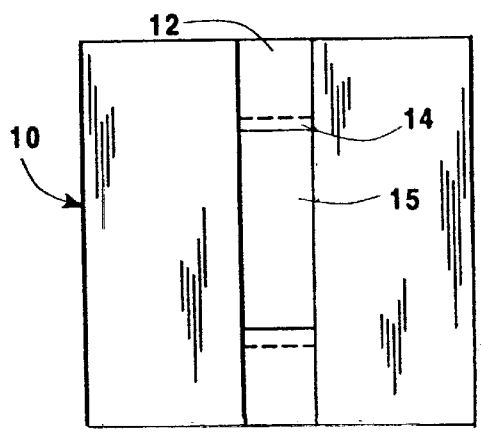
FIG. 1F shows a plan view of the repaired clear defect of FIG. 1A.

FIG. 1F shows a plan view of the repaired photomask 10 wherein the line 12 is now continuous wherein the defect 13 is filled with second repair material 15 including an undercut portion 14 of the same or different first repair material.

Figure 2A:
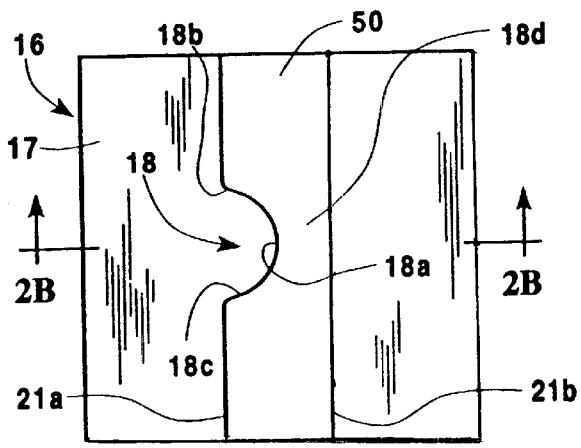
FIG. 2A shows an enlarged plan partial view of a photomask having a clear defect thereon.

Referring now to FIG. 2A, an enlarged plan partial view of a MoSi line containing photomask is shown. The photomask generally shown as 16 comprises a glass or quartz substrate 17 having a MoSi line 50 on the surface thereof. The line 50 has clear defect shown as 18 in the line. The clear defect 18 has sidewalls 18a, 18b and 18c. The numeral 18d represents the remainder of line 50 opposite the clear defect. Line 50 is shown having sidewalls 21a and 21b forming the boundaries of the conductor line 50.

Figure 2B:
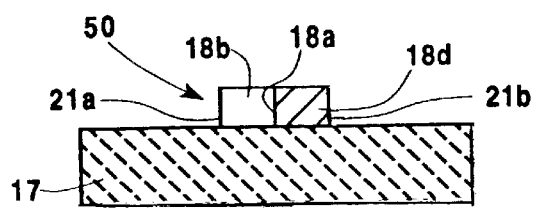
FIG. 2B is a cross-sectional side view along the lines 2B—2B of FIG. 2A.

FIG. 2B is a side view of FIG. 2A taken along lines 2B—2B. The defect in line 50 is shown having sidewall 18a and sidewall 18b.

Figure 2C:
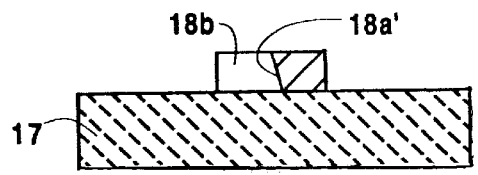
FIGS. 2C–2E show a series of steps to repair the clear defect of FIGS. 2A and 2B.

In FIG. 2C, sidewall 18a is shown being undercut forming new sidewall 18a'. Sidewalls 18b and 18c would similarly be undercut forming new sidewalls 18b' and 18c'.

Figure 2D:
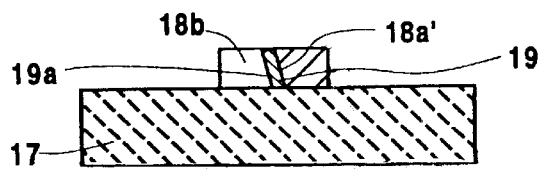

In FIG. 2D, a first repair material 19 is shown deposited on undercut sidewall 18a' forming a new sidewall 19a of the repair material 19.

Figure 2E:
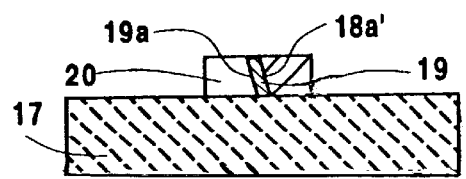

FIG. 2E shows a second repair material 20 filling the remainder of the clear defect 18.

Figure 2F:
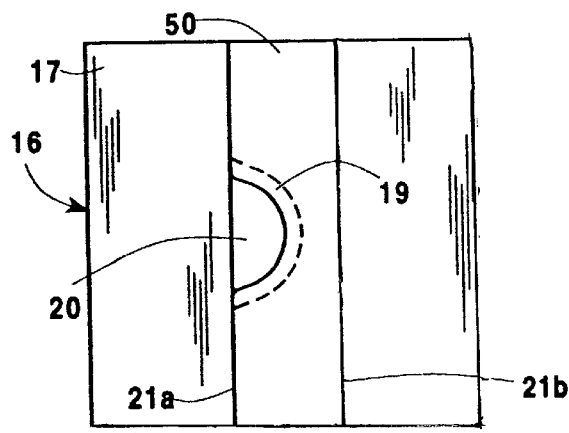
FIG. 2F is a plan view showing the photomask with the repaired clear defect.

In FIG. 2F, which is a plan view of the repaired photomask of FIG. 2A, the clear defect 18 of line 50 is shown having a second repair material 20 and an undercut first repair material 19 repairing the clear defect 18 of FIG. 2A. The second repair material 20 is deposited to preferably form a straight line along the plane of 21a and is preferably the same material as first repair material 19.

Figure 3A:
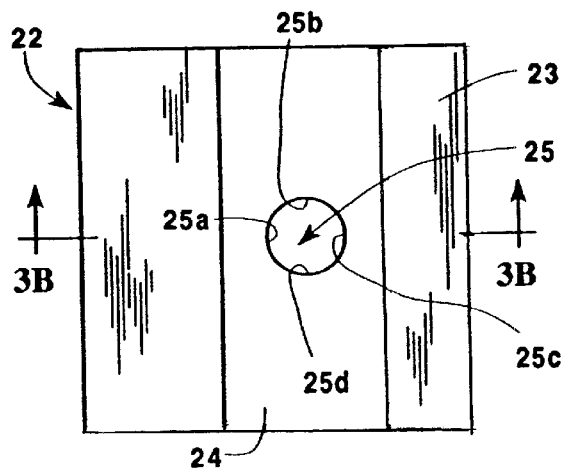
FIG. 3A shows an enlarged plan partial view of a photomask having a clear defect thereon.

Referring now to FIG. 3A, an enlarged plan partial view of a MoSi line containing photomask is shown. The photomask shown generally as 22 has a MoSi line 24 on the surface thereof. The line 24 is shown having a clear defect 25 therein. The defect 25 has sidewalls 25a, 25b, 25c and 25d.

Figure 3B:
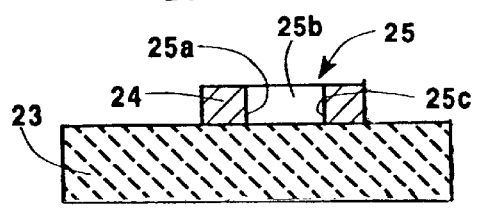
FIG. 3B is a cross-sectional side view along the lines 3B—3B of FIG. 3A.

FIG. 3B is a cross-sectional side view of the photomask of FIG. 3A taken along lines 3B—3B. The MoSi line material 24 is shown with the clear defect 25 having sidewalls 25a, 25b and 25c.

Figure 3C:
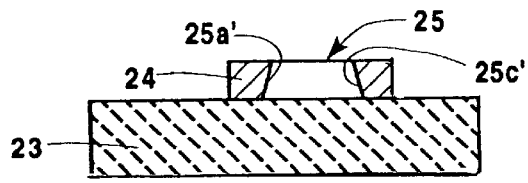
FIGS. 3C–3E show a series of steps to repair the clear defect of FIGS. 3A and 3B.

In FIG. 3C, the sidewalls 25a and 25c are shown undercut forming new undercut angled sidewalls 25a' and 25c'.

Figure 3D:
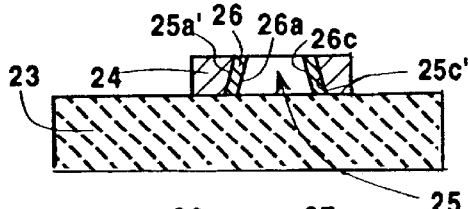

In FIG. 3D, a first repair material 26 is shown deposited on undercut angled sidewalls 25a' and 25c' forming new sidewalls 26a and 26c.

Figure 3E:
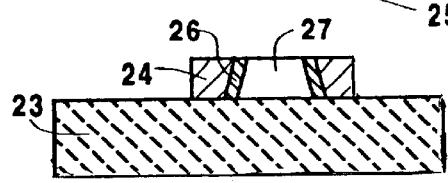

FIG. 3E shows the first deposit repair material 26 and another deposited second repair material 27 filling in clear defect 25.

Figure 3F:
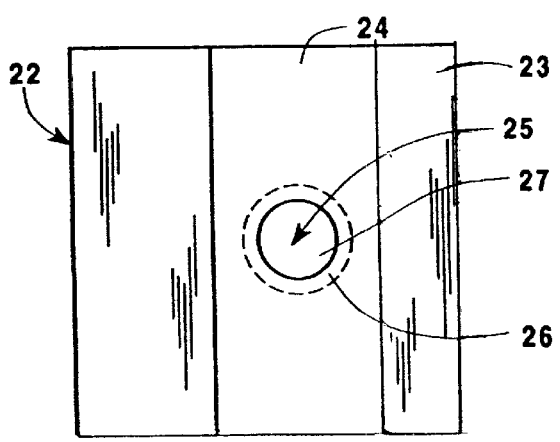
FIG. 3F shows a plan view of the photomask of FIG. 3A showing the repaired clear defect.

FIG. 3F shows a plan view of the repaired photomask of FIG. 3A wherein clear defect 25 is filled with second repair material 27 and undercut first repair material 26.

Any suitable energy source may be used for cutting the sidewalls of the defect. A laser beam, ion beam (preferably a focused ion beam) and micro machining are exemplary. The beam width can be controlled at any desired width and may be as narrow as 0.1 micron with a focused ion beam. The beam intensity may also vary widely and is essentially determined by the pattern material.

A preferred method of applying the repair material is by using a focus ion beam. Generally, an organo metallic gas such as $WF_6$ or dimethylgold trifluoro acetylacetonate is used and the gas is discharged from a gas nozzle and the gas supplied in the vicinity of the defect such as 13 shown in FIG. 1. The defect portion is radiated by the ion beam and the gas decomposed and selectively covers the new sidewall of the defect and fills in the defect. This repair method is found to be simple and has a high repair resolution of about ±0.1 microns making it an extremely effective means for repairing the defects in a pattern.

A preferred repair material is dimethylgold trifluoro acetylacetonate which when decomposed by the focused ion beam (FIB) provides a gold/carbon patch. The repair material may be used to fill in the undercut clear defect by depositing the repair material in the undercut defect until the defect is filled. A preferred method is to use a two step deposition procedure as shown in the Figures. Other repair materials include carbon.

Figure 4:
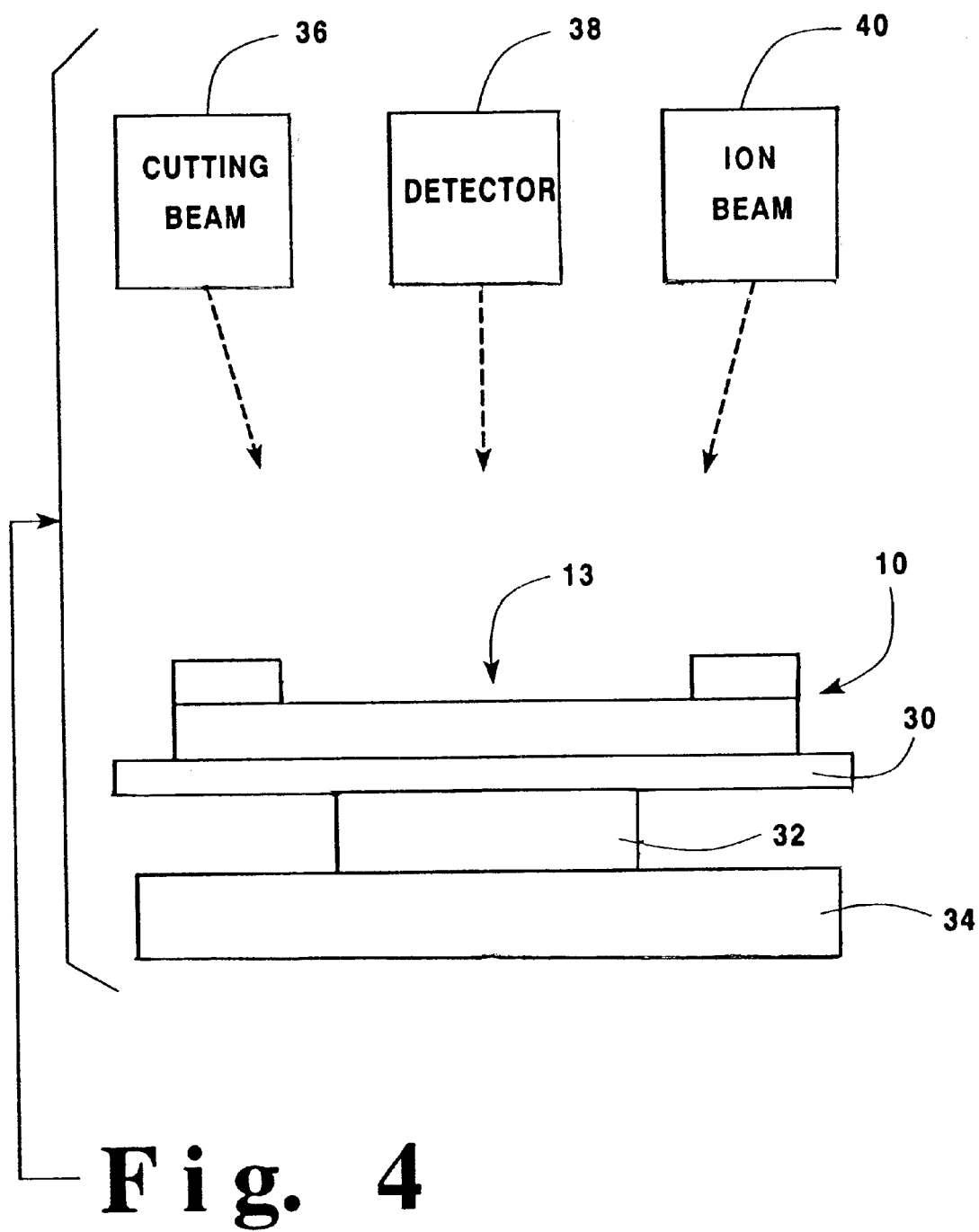
FIG. 4 is a side elevational view, partially in schematic, of the preferred apparatus for performing the repair method in accordance with the present invention.

The apparatus used to perform the preferred repair method in accordance with the present invention is shown in FIG. 4. Mask 10 is held in fixture 30 which is movable by conventional positioner 32 in the horizontal X-Y planes with respect to base 34. A detector 38 uses conventional optical or other methods to locate and identify the clear defect 13 in mask 10. A cutting beam generator 36 preferably directs a focused ion beam at an angle at the surface of the photomask to remove pattern material and form the angled, undercut sidewalls in the mask. Instead of the FIB, a laser beam generator or micro machining device may be employed to produce an energy beam in device 36. Prior to using the energy beam, the X-Y positioner 32 positions the mask to receive the energy beam at the proper location on the pattern material. Filling means 40, preferably directing a focused ion beam, fills the defect in mask 10 in accordance with the aforementioned method. If a focused ion beam is employed to cut as well as fill the pattern material, device 36 or 40 may be used for both steps.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of repairing a mask defect in a pattern layer on a substrate wherein the defect has sidewalls in the pattern layer, the layer having a top surface and a bottom surface on a top surface of a substrate, comprising:

undercutting said sidewalls of said defect to form new sidewalls having an angle wherein the top surface of said pattern layer overhangs the lower surface of said pattern layer; and filling said undercut defect with a repair material.

2. The method of claim 1 wherein said undercutting is by an energy beam.

3. The method of claim 1 wherein said filling comprises depositing said repair material with an ion beam.

4. The method of claim 1 wherein said filling is performed in two stages using the same repair material in each stage.

5. A photomask made by the method of claim 1.

6. A method for repairing a photolithography mask defect in a pattern layer on a substrate wherein the defect has sidewalls in the pattern layer, the layer having a top surface and a bottom surface on a top surface of a substrate, comprising:

undercutting said sidewalls of said defect to form new sidewalls having an angle, wherein the top surface of said pattern layer overhangs the lower surface of said pattern layer;

depositing a first portion of a first repair material on said new sidewall; and depositing a second portion of a second repair material substantially perpendicular to said top surface of said pattern layer, the second portion contacting said first portion and filling said defect.

7. The method of claim 6 wherein the depositing of said first portion of said first repair material substantially maintains the same angle of said sidewalls formed during said undercutting.

8. The method of claim 6 wherein said first repair material is the same as said second repair material.

9. The method of claim 6 wherein the depositing steps include depositing a carbon material.

10. The method of claim 6 wherein said undercutting and depositing is by one or more energy beams.

11. A photomask made by the method of claim 6.

12. An apparatus for repairing clear defects in photomasks used in the manufacture of electronic components including semiconductors, the photomask having a circuit pattern layer thereon, wherein the defect has sidewalls in the pattern layer, the layer having a top surface and a bottom surface and being positioned on a substrate the apparatus comprising:

a holding device for securing a photomask having a substrate and a circuit pattern layer thereon;

moving means for moving the secured photomask in an X-Y plane;

detecting means for locating and identifying a clear defect in the pattern layer, which defect has sidewalls in the pattern layer;

energy means to direct an angled energy beam at the surface of the photomask for removing pattern layer forming material from the sidewall of the photomask;

positioning means to position the photomask under the energy means so that the energy beam will be directed to a particular X-Y position of the photomask whereby when the defect is to be repaired, the photomask is positioned and the energy means activated to ablate (undercut) the defect sidewalls of the photomask pattern to undercut the sidewalls to form new angled sidewalls so that the top surface of the pattern layer overhangs the lower surface of said pattern layer; and filling means to fill the defect with a repair material.

13. The apparatus of claim 12 wherein the filling means is used to deposit a first repair material on the new sidewalls maintaining the same sidewall angle and a second filling means is used to deposit a second repair material substantially perpendicular to the top surface of the pattern layer, the second repair material contacting the first repair material and filling the defect.

14. The apparatus of claim 13 wherein the filling means deposits the first repair material which is the same as the second repair material.

15. The apparatus of claim 12 wherein said energy means comprises an ion beam.

16. The apparatus of claim 12 wherein said filling means comprises an ion beam.

17. A photomask comprising:

a substrate;

a pattern layer on the substrate with the layer having a top surface and a lower surface positioned on the substrate the layer having a clear defect therein, the defect having sidewalls which defect sidewalls are undercut so that the top surface of the pattern layer overhangs the lower surface of the pattern layer and a repair material fills the undercut defect.

18. The photomask of claim 17 wherein a first repair material is deposited on the undercut sidewalls and a second repair material fills the remainder of the undercut defect.

19. The photomask of claim 18 wherein the first repair material is the same as the second repair material.

* * * * *